(12) United States Patent
Tuominen

(10) Patent No.: US 10,643,928 B2
(45) Date of Patent: May 5, 2020

(54) ELECTRONIC DEVICE WITH A PLURALITY OF COMPONENT CARRIER PACKAGES BEING ELECTRICALLY AND MECHANICALLY CONNECTED

(71) Applicant: AT&S (China) Co. Ltd., Shanghai (CN)

(72) Inventor: Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 15/780,000

(22) PCT Filed: Nov. 30, 2016

(86) PCT No.: PCT/IB2016/057212
§ 371 (c)(1),
(2) Date: May 30, 2018

(87) PCT Pub. No.: WO2017/093907
PCT Pub. Date: Jun. 8, 2017

(65) Prior Publication Data
US 2018/0350725 A1     Dec. 6, 2018

(30) Foreign Application Priority Data
Nov. 30, 2015   (CN) ................. 2015 2 0975278 U

(51) Int. Cl.
*H01L 23/49*   (2006.01)
*H01L 25/065*   (2006.01)
(Continued)

(52) U.S. Cl.
CPC ...... *H01L 23/492* (2013.01); *H01L 23/49816* (2013.01); *H01L 23/49822* (2013.01);
(Continued)

(58) Field of Classification Search
CPC ............ H01L 23/492; H01L 23/49816; H01L 23/49822; H01L 23/5383; H01L 23/5384;
(Continued)

(56) References Cited

U.S. PATENT DOCUMENTS 7,030,469 B2 *   4/2006   Mahadevan .......... H01L 21/561
                                                                    257/659
7,618,846 B1   11/2009   Pagalia et al.
(Continued)

FOREIGN PATENT DOCUMENTS

CN        103295988 A     9/2013
CN        104851858 A     8/2015
CN        205542769 U     8/2016

*Primary Examiner* — Ida M Soward
(74) *Attorney, Agent, or Firm* — Robert A. Blaha; Smith Tempel Blaha LLC

(57) ABSTRACT

An electronic device includes first and second component carrier packages having respective embedded electronic components and at least one respective external terminal. The second component carrier package is mounted on the first component carrier package by electrically and mechanically connecting the at least one respective external terminals. The first component carrier package further includes an electromagnetic radiation shielding structure formed as an electrically conductive coating and being configured for at least partially shielding electromagnetic radiation from propagating between an exterior and an interior of the first component carrier package.

19 Claims, 5 Drawing Sheets

(51) Int. Cl.
*H01L 25/10* (2006.01)
*H01L 25/04* (2014.01)
*H01L 25/07* (2006.01)
*H01L 25/11* (2006.01)
*H01L 23/492* (2006.01)
*H01L 23/538* (2006.01)
*H01L 23/552* (2006.01)
*H01L 23/498* (2006.01)
*H01L 23/00* (2006.01)
H01L 25/18 (2006.01)

(52) U.S. Cl.
CPC ...... *H01L 23/5383* (2013.01); *H01L 23/5384* (2013.01); *H01L 23/5389* (2013.01); *H01L 23/552* (2013.01); *H01L 24/20* (2013.01); *H01L 24/32* (2013.01); *H01L 24/83* (2013.01); *H01L 25/0657* (2013.01); *H01L 25/105* (2013.01); *H01L 25/18* (2013.01); *H01L 2224/04105* (2013.01); *H01L 2224/06181* (2013.01); *H01L 2224/12105* (2013.01); *H01L 2224/2518* (2013.01); *H01L 2225/06524* (2013.01); *H01L 2225/1035* (2013.01); *H01L 2225/1058* (2013.01); *H01L 2924/3025* (2013.01); *H01L 2924/3511* (2013.01); *H01L 2924/37001* (2013.01)

(58) Field of Classification Search
CPC ... H01L 23/5389; H01L 23/552; H01L 24/32; H01L 24/83; H01L 25/0657; H01L 25/105; H01L 25/043; H01L 25/074; H01L 25/0756; H01L 25/117
See application file for complete search history.

(56) References Cited

U.S. PATENT DOCUMENTS

| | | | |
|---|---|---|---|
| 7,683,469 B2 | 3/2010 | Oh et al. | |
| 8,508,048 B2 | 8/2013 | Honjo | |
| 8,546,929 B2 | 10/2013 | Ong et al. | |
| 8,587,096 B2* | 11/2013 | Kim | H01L 21/561 257/659 |
| 8,637,963 B2* | 1/2014 | Upadhyayula | H01L 23/3135 257/508 |
| 8,872,319 B2* | 10/2014 | Kim | H01L 25/16 257/686 |
| 9,209,121 B2* | 12/2015 | Goida | H01L 23/04 |
| 9,520,387 B2* | 12/2016 | Kim | H01L 25/16 |
| 9,583,430 B2* | 2/2017 | Park | H01L 23/3128 |
| 9,842,826 B2* | 12/2017 | Lin | H01L 25/0657 |
| 10,014,245 B2* | 7/2018 | Seddon | H01L 23/49827 |
| 10,026,671 B2* | 7/2018 | Yu | H01L 25/50 |
| 2007/0108582 A1* | 5/2007 | Karnezos | H01L 23/3128 257/686 |
| 2008/0036096 A1* | 2/2008 | Karnezos | H01L 23/3128 257/778 |
| 2009/0302437 A1* | 12/2009 | Kim | H01L 21/561 257/659 |
| 2010/0078788 A1 | 4/2010 | Wagiman et al. | |
| 2010/0109145 A1 | 5/2010 | Veninga | |
| 2013/0193574 A1* | 8/2013 | Farooq | H01L 23/481 257/741 |
| 2014/0264808 A1* | 9/2014 | Wolter | H01L 25/0657 257/678 |
| 2014/0319684 A1* | 10/2014 | Suzuki | H01L 21/84 257/746 |
| 2015/0061095 A1 | 3/2015 | Choi et al. | |
| 2015/0318267 A1* | 11/2015 | Yu | H01L 23/481 257/774 |
| 2016/0013155 A1* | 1/2016 | Chung | H01L 25/0657 257/659 |
| 2016/0276307 A1* | 9/2016 | Lin | H01L 21/561 |

* cited by examiner

ELECTRONIC DEVICE WITH A PLURALITY OF COMPONENT CARRIER PACKAGES BEING ELECTRICALLY AND MECHANICALLY CONNECTED

TECHNICAL FIELD

The invention relates to an electronic device and an electronic arrangement. Furthermore, a method of manufacturing an electronic device is disclosed.

TECHNOLOGICAL BACKGROUND

Conventionally, two electronic components are directly stacked one on top of the other to form a so-called package on package (PoP) module, before they are PCB-packaged together. The two electronic components (for example a processor component and a memory component) are assembled by solder paste being provided in-between the two electronic components. The PoP modules assembled in such a way are conventionally associated with co-planarity and warpage issues resulting on the one hand in reliability issues during use of the PoP module and on the other hand in yield loss in the production.

SUMMARY

There may be a need to enable compact packaging of electronic components with high robustness and at the same time overcoming warpage issues, thus having a reliable design.

An electronic device and an electronic arrangement according to the independent claims are provided. Furthermore, a method of manufacturing an electronic device is disclosed as another exemplary embodiment of the invention.

According to an exemplary embodiment of the invention, an electronic device is provided which comprises a first component carrier package comprising a first electronic component embedded in the first component carrier package and comprising at least one first external terminal, and a second component carrier package comprising a second electronic component embedded in the second component carrier package and comprising at least one second external terminal, wherein the second component carrier package is mounted on the first component carrier package by electrically and mechanically connecting (directly or indirectly) the at least one first external terminal with the at least one second external terminal, wherein the first component carrier package further comprises a first electromagnetic radiation shielding structure, in particular formed as an electrically conductive coating, the first electromagnetic radiation shielding structure being configured for at least partially shielding electromagnetic radiation from propagating between an exterior and an interior of the first component carrier package.

According to another exemplary embodiment of the invention, an electronic arrangement is provided which comprises an electronic device having the above-mentioned features, and a mounting base, in particular a printed circuit board, on which the electronic device is mounted so that at least part of the at least one second external terminal provides an electric connection between the electronic device and the mounting base, in particular via solder structures.

According to still another exemplary embodiment of the invention, a method of manufacturing an electronic device is provided, wherein the method comprises embedding a first electronic component in a first component carrier package comprising at least one first external terminal, embedding a second electronic component in a second component carrier package comprising at least one second external terminal, and mounting the second component carrier package on the first component carrier package by electrically and mechanically connecting the at least one first external terminal with the at least one second external terminal, wherein the first component carrier package further comprises a first electromagnetic radiation shielding structure, in particular formed as an electrically conductive coating, the first electromagnetic radiation shielding structure being configured for at least partially shielding electromagnetic radiation from propagating between an exterior and an interior of the first component carrier package.

OVERVIEW OF EMBODIMENTS

In the context of the present application, the term "component carrier package" may particularly denote any package or casing which is capable of accommodating one or more electronic components therein for providing both mechanical support and electrical connectivity.

In the context of the present application, the term "external terminal" may particularly denote an exposed electrically conductive structural feature which may provide an electrically conductive connection being able of transmitting electrical signals from one element to another element. The external terminal may be formed as a pad which may be soldered or glued in an electrically conductive way to another contact pad being part of for example a printed circuit board or to another (in particular the second) external terminal. Particularly, the external terminal may be any structural feature providing the possibility to electrically couple and mechanically connect the element being equipped with the external terminal, with another element. When two elements are connected to each other, each element may comprise an individual external terminal. The two individual external terminals may be identical or different in shape and performance.

In the context of the present application, the term "electrically and mechanically connecting" may particularly denote that the first external terminal and the second external terminal are connected with each other directly (i.e. without material in between) or indirectly (i.e. with intermediate material in between) such that the first component carrier package and the second component carrier package are inhibited from moving relatively to each other. The connecting of the first external terminal(s) with the second external terminal(s) may be established by an additional structure, in particularly a solder structure.

According to an exemplary embodiment of the invention, an electronic device is provided forming an integral structure of a first component carrier package and a second component carrier package each having embedded therein a respective electronic component and being connected to one another electrically and mechanically by cooperating terminals. With such a board-on-board architecture, it is possible to reliably protect the embedded electronic components while obtaining a compact electronic device. Simultaneously, functional cooperation between the electronic components embedded in the component carrier packages and/or with regard to an electronic environment can be enabled by the electric coupling opportunity via the exposed terminals.

Furthermore, electromagnetic interference (EMI) may be efficiently prevented by the electromagnetic radiation shielding.

In the following, further exemplary embodiments of the electronic de-vice, the electronic arrangement and the method will be explained.

In an exemplary embodiment of the invention, the first electronic component and the second electronic component may differ from each other, for example may be of a different kind of electronic component. For instance, the first electronic component may be a processor and the second electronic component may be a memory component. Also the size of the first electronic component and the second component may differ. Thus, it may be possible to build a PoP module in which a memory having a defined dimension may be connected to a processor which may have a comparatively smaller dimension. This allows realizing even complex electronic functionality.

By a proper adjustment of the properties of the component carrier packages and their constituents in terms of thermal expansion and thermal conductivity, warpage, damage or connection failure due to a different thermal expansion of the first electronic component and the second electronic component may effectively be suppressed and avoided.

The terminals of the first electronic component and the terminals of the second electronic component may be different from each other, for example in shape, kind, size or quantity, if two different kinds of electronic components are used. However, the first external terminals of the first component carrier package and the second external terminals of the second component carrier package can be adapted to each other such that a connection between the first external terminals and the second external terminals and thus between the first electronic component and the second electronic component can be accomplished.

In an embodiment, the electronic component may comprise an adhesive structure configured for electrically and mechanically connecting the at least one first external terminal with the at least one second external terminal. In the context of the present application "adhesive structure" may particularly denote an adhesive layer (or body of another shape) being applicable on either the at least one first external terminal or the at least one second external terminal, or on both. Furthermore, a preferred adhesive structure may in particular be made of a paste or a film and may be electrically conductive such that the adhesive structure is able to conduct an electric current, power or signal between the at least one first external terminal and the at least one second external terminal being fixed together by the adhesive structure. Additionally, the adhesive structure may, after curing, provide a mechanical connection between the at least one first external terminal and the at least one second external terminal such that the first component carrier package and the second component carrier package may be prevented from moving relatively to each other. Thus, the application of the adhesive structure may be easy, fast and reliable in terms of simultaneously providing mechanical connection and electrical coupling.

In an embodiment, the adhesive structure comprises at least one of the group consisting of an Anisotropic Conductive Film (ACF) and an Anisotropic Conductive Paste (ACP). An ACF is an adhesive interconnection system in the shape of a film that is used to establish electrical and mechanical connections. ACF can be used alternatively in the form of a paste referred to as ACP. Although an Anisotropic Conductive Film is usually preferred, other adhesives may be used as well. The Anisotropic Conductive Film may be a partially conductive adhesive comprising particles consisting of copper. The connection between the at least one first external terminal and the at least one second external terminal being of different geometrical sizes may be difficult. The particles of copper in the Anisotropic Conductive Film allow a connection between very small external terminals being present in for example the at least one first external terminal, and large external terminals being present in for example the at least one second external terminal, being fixed to each other.

In an embodiment, the first electromagnetic radiation shielding structure comprises an electrically conductive coating.

In an embodiment, the first electromagnetic radiation shielding structure surrounds at least part of the first component carrier package, in particular at least partially covers lateral sidewalls of the first component carrier package. Thus, it may be sufficient to plate at least partially the lateral sidewalls of the first component carrier package with electrically conductive material to provide the electromagnetic radiation shielding structure. Hence, with only insignificant increase of the dimensions and the weight of the first component carrier package, an efficient electromagnetic radiation shielding structure may be formed.

In an embodiment, the second component carrier package further comprises a second electromagnetic radiation shielding structure, in particular comprising an electrically conductive coating, the second electromagnetic radiation shielding structure being configured for shielding electromagnetic radiation from propagating between an exterior and an interior of the second component carrier package.

In the context of the present application, an "electromagnetic radiation shielding structure" may particularly denote a shielding structure comprising or consisting of an electrically conductive material as for example metal. Although metal is the preferred material for the shielding structure, any other material being capable of shielding electromagnetic radiation from propagating from the exterior to the interior of the first component carrier package, in particular to the first electronic component, or from the interior of the first component carrier package to the exterior, in particular to other electronic components, can be implemented as well. Thus, electromagnetic interference (EMI) between different electronic components may be efficiently prevented. Additionally, the electromagnetic radiation shielding structure may inhibit intra-electronic device distortions caused by electromagnetic radiation. However, additionally or alternatively, also electromagnetic interference between several electronic components positioned on the same printed circuit board can be suppressed by a correspondingly configured electromagnetic radiation shielding structure (i.e. inhibiting intra-electronic device distortion).

In the context of the present application, the term "comprising an electrically conductive coating" may particularly denote that the electromagnetic radiation shielding is formed as a layer of electrically conductive material deposited on the packaging structure of the respective component carrier package.

In an embodiment, a second electromagnetic radiation shielding structure surrounds at least part of the second component carrier package, in particular at least partially covers lateral sidewalls of the second component carrier package. Thus, it may be sufficient to plate at least partially the lateral sidewalls of the second component carrier package with electrically conductive material to provide the electromagnetic radiation shielding structure. Hence, with an only insignificant increase of the dimensions and/or the weight of the second component carrier package, an efficient electromagnetic radiation shielding structure may be formed.

In an embodiment, the first electromagnetic radiation shielding structure and the second electromagnetic radiation shielding structure are configured to cooperate, in particular are connected to one another, such that the electronic device is entirely or at least substantially entirely surrounded by the first electromagnetic radiation shielding structure and the second electromagnetic radiation shielding structure. In the context of the present application the term "entirely surrounded" may particularly denote that the first component carrier package and the second component carrier package may together be in the interior of a shielding structure formed by the first electromagnetic radiation shielding structure and the second electromagnetic radiation shielding structure, without or substantially without non-shielding gaps. The first electromagnetic radiation shielding structure and the second electromagnetic radiation shielding structure may form a hermetic enclosure such that there is no possibility for electromagnetic radiation to propagate from the interior to the exterior or vice versa.

In an embodiment, the electronic device further comprises an integral electromagnetic radiation shielding structure for providing a hermetic electronic shielding of the electronic device, wherein the electronic device is entirely surrounded by the electromagnetic radiation shielding structure. The first component carrier package and the second component carrier package may first be connected together via the at least one first external terminal and the at least one second external terminal. Subsequently, the electromagnetic radiation shielding structure may be applied to the so formed electronic device in one shielding formation procedure such that the electromagnetic radiation shielding structure entirely surrounds the electronic device without the need of providing a connection between different parts of the electromagnetic radiation shielding structures. Thus, any potential leakage of electromagnetic radiation may be efficiently avoided.

In an embodiment, the electromagnetic radiation shielding structure is made by electroless plating.

In an embodiment, at least one of the group consisting of the first component carrier package and the second component carrier package comprises or consists of a stack of at least one electrically insulating layer structure and/or at least one electrically conductive layer structure. For example, the component carrier package may be a laminate of the mentioned electrically insulating layer structure(s) and the electrically conductive layer structure(s), in particular formed by applying mechanical pressure, if desired supported by thermal energy. The mentioned stack may provide a plate-shaped first component carrier package and a plate-shaped second component carrier package capable of providing a sufficiently large embedding volume for embedding the respective electronic components and a large assembling surface for connecting a high number of first external terminals and second external terminals. The term "layer structure" may particularly denote a continuous layer, a patterned layer and/or a plurality of non-consecutive islands within a common plane.

In an embodiment, the at least one electrically conductive layer structure of at least one of the first component carrier package and the second component carrier package comprises at least one of the group consisting of copper, aluminum, and nickel. Although copper is usually preferred, other materials are possible as well.

In an embodiment, the at least one electrically insulating layer structure of at least one of the first component carrier package and the second component carrier package comprises at least one of the group consisting of resin, in particular Bismaleimid-Triazine resin, cyanate ester, glass, in particular glass fibers prepreg material, polyamide, liquid crystal polymer, epoxy-based Build-Up film, FR4 material, FR5 material, a ceramic, and a metal oxide. Although prepreg or FR4 and/or FR5 are usually preferred, other materials may be used as well.

In an embodiment, at least one of the group consisting of the first component carrier package and the second component carrier package is shaped as a plate, particularly as a flat plate. This contributes to the compact design of the component carrier packages, wherein the first component carrier package nevertheless provides a large basis for connecting the second component carrier package and vice versa. Furthermore, even a very thin embedded electronic component may be conveniently embedded, thanks to its small thickness, into a thin plate.

In an embodiment, a package structure of at least one of the first component carrier package and the second component carrier package comprises or consists of one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. One or more electronic components may be embedded in a printed circuit board.

In the context of the present application, the term "substrate" may particularly denote a small component carrier having substantially the same size as an electronic component to be mounted therein.

In an embodiment, a package structure of at least one of the first component carrier package and the second component carrier package comprises or consists of a laminate, in particular a laminate type component carrier package. In such an embodiment, the component carrier package is a compound of multiple layer structures which are stacked and connected together by applying a pressing force, if desired accompanied by heat.

In an embodiment, at least one of the group consisting of the first electronic component and the second electronic component is selected from the group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. For example, a magnetic element can be used as an electronic component.

Such a magnetic element may be a permanent magnetic element (such as a ferromagnetic element, an antiferromagnetic element or a ferrimagnetic element, for instance a ferrite core) or may be a paramagnetic element. However, other electronic components, in particular those which generate and emit electromagnetic radiation and/or are sensitive with regard to electromagnetic radiation propagating to the electronic component from an environment, may be embedded in the electronic device.

In an embodiment, the first component carrier package and the second component carrier package have different sizes. The at least one first external terminal and the at least one second external terminal are connected together such that a connection between the first component carrier package and the second component carrier package may be providable. Thus, a connection of the first component carrier package and the second component carrier package having different sizes is easily providable, if desired. Hence, an increased flexibility for connecting electronic components having different sizes which influence the exterior size of the component carrier package, is providable.

In an embodiment, the first electronic component and the second component have different sizes. Even when the first electronic component and the second electronic component have different sizes, the first component carrier package and the second component carrier package may have the same size such that a connection between the first component carrier package and the second component carrier package is easily providable. Thus, an easy connection may be present in-between the first component carrier package and the second component carrier package having electronic components of different sizes embedded.

In an embodiment, the first component carrier package and the second component carrier package differ concerning at least one of the group consisting of a number of layer structures, and a number of external terminals. Comprising a different number of layer structures may be an advantage when the first electronic component and the second electronic component have different thicknesses and/or sizes. Thus, the different thicknesses and/or sizes of the electronic components may be evened by providing a certain number of layer structures resulting in an equal thickness and/or even size of the first component carrier package and the second component carrier package. By providing a different number of first external terminals and second external terminals, electronic components requiring a different number of terminals for example for their respective fan-out, may be connected together, in particular by using an Adhesive Conductive Film (ACF).

In an embodiment, the electronic device further comprises a third component carrier package comprising a third electronic component embedded in the third component carrier package and comprising at least two third external terminals, wherein a first of the at least two third external terminals is provided at a first main surface of the third component carrier package, wherein a second of the at least two third external terminals is provided at a second main surface of the third component carrier package, opposing the first main surface of the third component carrier package, and wherein the third component carrier package is mounted in-between the first component carrier package and the second component carrier package by electrically and mechanically connecting the first of the at least two third external terminals with the at least one second external terminal, and by electrically and mechanically connecting the second of the at least two third external terminals with the at least one first external terminal. The third electronic component carrier package may comprise third external terminals positioned on both of the main surfaces of the third component carrier package. Thus, more than two (i.e. also three or more) electronic components may be stacked on top of each other. The third external terminals on both main surfaces of the third component carrier package may be individually adapted to the requirements of the first external terminals and the second external terminals, respectively.

In an embodiment, the electronic device further comprises electric contact provisions such as solder structures, in particular solder balls, arranged on at least part of the at least one second external terminal and configured for mounting the electronic device on a mounting base, in particular on a printed circuit board. Although solder balls may be preferred, other solder structures may be used as well. The solder balls may be provided at a main surface of the electronic device with which the electronic device will be soldered to the mounting base. The solder balls are preferably already provided at the main surface, in particular on the surface opposing the first external terminals. When both the mounting base and the packaging portion of the respective component carrier package is made of printed circuit board (PCB) materials, thermal stress due to different thermal expansion of different materials can be suppressed or even prevented when the electronic device is mounted on the mounting base.

In an embodiment, the first component carrier package and/or the second component carrier package is or are readily manufactured prior to a mounting of the second component carrier package on the first component carrier package. Thus, the dwell time of the first component carrier package and the second component carrier package at the assembly site may be reduced and the delivery rate of electronic devices is increasable.

BRIEF DESCRIPTION OF THE DRAWINGS

The invention will be described in more detail hereinafter with reference to examples of embodiment but to which the invention is not limited.

DETAILED DESCRIPTION OF EXEMPLARY EMBODIMENTS

Figure 1:
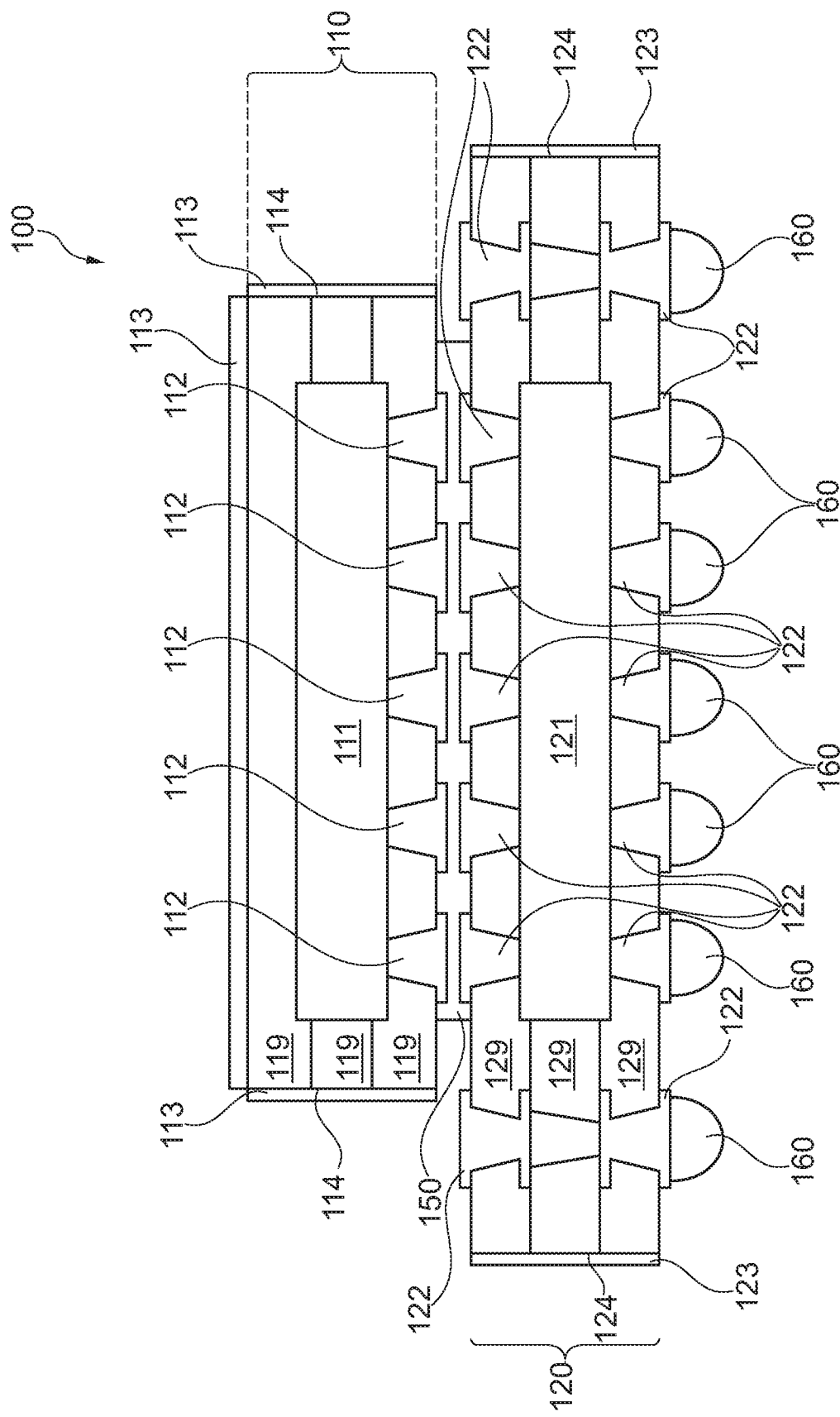
FIG. 1 shows a cross-sectional view of an electronic device obtained by carrying out a method of manufacturing an electronic device according to an exemplary embodiment of the invention.

The aspects defined above and further aspects of the invention are apparent from the examples of embodiment to be described hereinafter and are explained with reference to these examples of embodiments.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to one exemplary embodiment of the invention, an electronic device is provided which is implemented in a Package-on-Package architecture. Technologies, which can be advantageously combined according to exemplary embodiments of the invention, are embedding, Adhesive Conductive Film (ACF) connection and edge plating technology to provide EMI protection. The combination of these technologies allows creating a PoP module with high reliability and fully shielded electronic components. With this technology, printed circuit board (PCB) manufacture may perform packaging and utilize wafer level components directly to create embedded packages with shielding (i.e. electromagnetic radiation shielding). Manufacturing of such an electronic component may be done by first creating two modules to be embedded (i.e. a first electronic component and a second electronic component) and two individual embedding packages, respectively (i.e. first component carrier package and second component carrier package), preferably with edge plating on the sides (i.e. functioning as electromagnetic radiation shielding structure). Alternatively, full copper shielding may be used. Then, the embedded packages may be bonded together, for instance with ACF (i.e. constituting an adhesive structure), to create a connection between the embedded packages and the electronic modules therein. Furthermore, the method may comprise adding solder balls to finalize the PoP module (i.e. electronic device). This can finalize the packaging procedure.

Creating a PoP module (i.e. electronic device) on a main board (i.e. mounting base), this technology provides a method that can avoid or at least suppress co-planarity and warpage issues during the PoP module assembly. The assembly issues with PoP modules create yield loss in the production and additionally cause reliability issues afterwards. Such problems can be overcome by simply embodiment of the invention. An additional advantage of exemplary embodiments is that the modules (i.e. the embedded electronic components) can be fully shielded.

Traditionally, a PoP module is assembled with solder paste. A processor component and a memory component are then placed directly on top of each other. This may result in a yield loss for the PoP modules due to warpage and connection failures.

An electronic device according to an exemplary embodiment of the invention has the benefit that the electronic device comprises a reliable design with no issues of warpaging. Additionally, the electronic device does not suffer from leakage of electromagnetic radiation that may disturb other devices or signals nearby the module.

In FIG. 1, an electronic device 100 according to an exemplary embodiment is shown. The electronic device 100 comprises a first component carrier package 110 comprising a first electronic component 111 embedded in the first component carrier package 110 and comprising a plurality of first external terminals 112. Furthermore, the electronic device 100 comprises a second component carrier package 120 comprising a second electronic component 121 embedded in the second component carrier package 120 and comprising a plurality of second external terminals 122. The first component carrier package 110 is mounted on the second component carrier package 120 by electrically and mechanically connecting the first external terminals 112 with a part of the second external terminals 122. However, another part of the second external terminals 122 remain exposed at a bottom surface of the electronic device 100, as shown in FIG. 1. More specifically, the first component carrier package 110 comprises five first external terminals 112 and the second component carrier package 120 comprises two sets of second external terminals 122. Each of these sets comprises seven second external terminals 122. One of the sets is arranged at one main surface of the second component carrier package 120, whereas the other set is arranged on the other main surface of the second component carrier package 120. The five first external terminals 112 and one of the sets of seven second external terminals 122 used for connecting the component carrier packages 110, 120 to one another are each positioned on one main surface of the first component carrier package 110 and second component carrier package 120, respectively, such that they are opposite of each other. The other set of seven second external terminals 122 are positioned on another main surface of the second component carrier package 120, being opposite to the one main surface of the second component carrier package 120. All five first external terminals 112 and five of the seven second external terminals 122 on the one main surface of the second component carrier package 120 are electrically and mechanically connected to each other by an adhesive structure 150 such as an Anisotropic Conductive Film (ACF).

Although a one-to-one correlation of five first external terminals 112 and the corresponding five second external terminals 122 is shown in FIG. 1, a different number of first external terminals 112 and second external terminals 122 may be provided in functional cooperation with the adhesive structure 150. Hence, the first component carrier package 110 and the second component carrier package 120 may have a different number of external terminals 112, 122 for example due to different fan-out of the first electronic component 111 embedded in the first component carrier package 110 and the second electronic component 121 embedded in the second component carrier package 120. The first electronic component 111 in FIG. 1 may be a memory and the second electronic component 121 in FIG. 1 may be a processor. It may be advantageous to position the processor (second electronic component 121) in direct contact with a printed circuit board as a mounting base, because the processor (second electronic component 121) may need more ball grid connections to a mounting base (not shown in FIG. 1 but shown in detail in FIG. 2) than the memory (first electronic component 111).

The first component carrier package 110 is formed by three first layer structures 119 all having the same thickness and defining a recess or accommodation volume in which the first electronic component 111 is embedded. The second component carrier package 120 is formed by three second layer structures 129 all having the same thickness and defining a recess or accommodation volume in which the second electronic component 121 is embedded. Each of the first layer structures 119 and the second layer structures 129 may be an electrically insulating layer structure or an electrically conductive layer structure.

Figure 2:
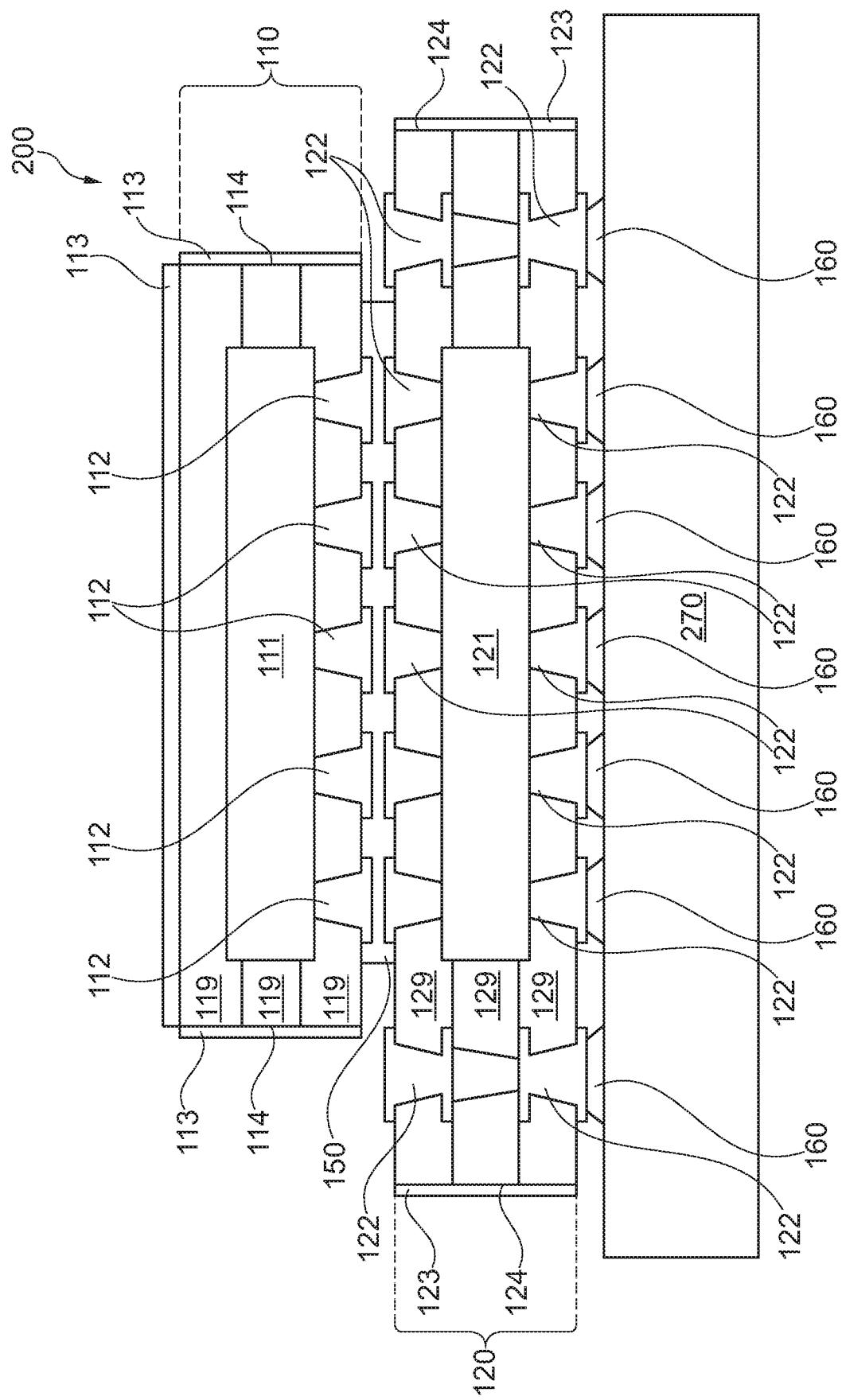
FIG. 2 shows a cross-sectional view of an electronic arrangement comprising an electronic device and a mounting base, according to an exemplary embodiment of the invention.

The electronic device 100 shown in FIG. 1 further comprises a plurality of solder structures 160, here embodied as solder balls, which are arranged on each of the seven second external terminals 122 being positioned on the lower main surface of the second component carrier package 120 according to FIG. 1. The solder structures 160 are configured for mounting the electronic device 100 on mounting base 270, as shown in FIG. 2. The solder balls 160 may be provided on the second external terminals 122 after completing the manufacturing of the electronic device 100 and prior to mounting the electronic device 100 to the mounting base 270.

As may be taken from FIG. 1, the first component carrier package 110 moreover comprises a first electromagnetic radiation shielding structure 113 being configured for shielding electromagnetic radiation from propagating between an exterior and an interior of the first component carrier package 110. The first electromagnetic radiation shielding structure 113 is provided as an electrically conductive coating on one main surface of the first component carrier package 110 and on two lateral surfaces 114 being parallel and running perpendicular to the main surfaces of the first component carrier package 110. Thus, the propagation of electromagnetic radiation is inhibited from propagating from the first electronic component 111 to the exterior of the first component carrier package 110. Hence, the first electronic component 111 may not be able to disturb signals being present around the electronic device 100. At the same time, the first electronic component 111 is protected from electromagnetic radiation radiated by external sources.

Furthermore, the second component carrier package 120 comprises a second electromagnetic radiation shielding structure 123 being configured for shielding electromagnetic radiation from propagating between an exterior and an interior of the second component carrier package 120. The second electromagnetic radiation shielding structure 123 is provided as an electrically conductive coating on two lateral surfaces 124 being parallel and running perpendicular to the main surfaces of the second component carrier package 120. Thus, the propagation of electromagnetic radiation is inhibited from propagating from the second electronic component 121 to the exterior of the second component carrier package 120. Thus, the second electronic component 121 may not be able to disturb signals being present around the electronic device 100. At the same time, the second electronic component 121 is protected from electromagnetic radiation radiated by external sources.

As can be taken from FIG. 2, an electronic arrangement 200 is shown. The electronic arrangement 200 comprises the electronic device 100 as described above in connection with FIG. 1, and a mounting base 270 on which the electronic device 100 is mounted so that some of the second external terminals 122 provide an electric connection between the electronic device 100 and the mounting base 270 via the solder structure 160. The mounting base 270 may be a printed circuit board (PCB). One main surface of the second component carrier package 120 is facing one main surface of the first component carrier package 110. The mounting base 270 is provided with terminals (not shown in the figure) being designed for being connected with the seven second external terminals 112 exposed on the previously unconnected main surface of the second component carrier package 120, being opposite the one main surface of the second component carrier package 120. The terminals of the mounting base 270 may be thermo-resistant such that the seven second external terminals 112 which are shown on the lower main surface of the second component carrier package 120 in FIG. 2 may be soldered to the mounting base 270 via solder structures 160. As may be seen in FIG. 2, after connecting the electronic device 100 to the mounting base 270, the solder structures 160 may have another shape as before the connecting. The connecting is carried out under heat conditions and if necessary under pressure conditions such that the solder balls 160 begin to melt and form a connection with the terminals of the mounting base 270. After a cool down and/or after removal of the pressure, the solder structures 160 solidify and then provide a strong mechanical and electrical connection between the electronic device 100 and the mounting base 270. The solder structure 160 is made of a material that ensures that the solder structure 160 is spatially limited to the external terminals of the mounting base 270. Hence, short-circuits established by electrically connecting other electronic parts on the mounting base 270 than the external terminals of the mounting base 270 with the second external terminals 122 of the second component carrier package 120 are effectively avoided.

Figure 3:
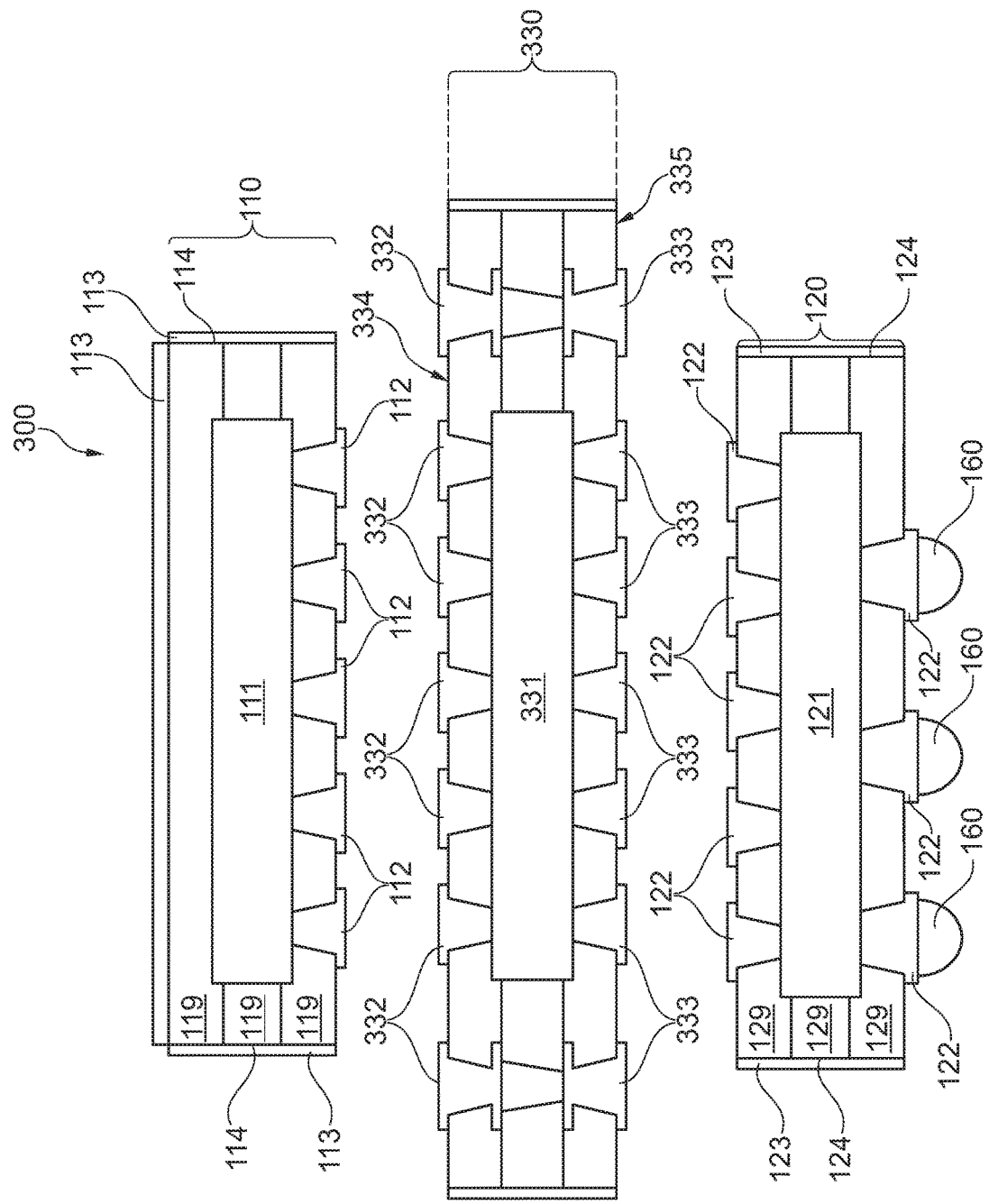
FIG. 3 shows a cross-sectional view of a pre-form of an electronic device, prior to assembly of individual component carrier packages with one another, which additionally comprises a third component carrier package mounted in-between a first component carrier package and a second component carrier package, according to an exemplary embodiment of the invention.

In FIG. 3, a pre-form of an electronic device 100 according to another exemplary embodiment of the invention is shown which comprises the first component carrier package 110 as described in detail in connection with FIG. 1, a second component carrier package 120 and a third component carrier package 330. The third component carrier package 330 comprises a third electronic component 331 embedded in the third component carrier package 330 and comprises two kinds of third external terminals 332 and 333. The third component carrier package 330 comprises seven third external terminals 332. The seven third external terminals 332 are provided at a first main surface 334 of the third component carrier package 330. Furthermore, the third component carrier package 330 comprises seven third external terminals 333. The seven third external terminals 333 are provided at a second main surface 335 of the third component carrier package 330, opposing the first main surface 334 of the third component carrier package 330. The third component carrier package 330 in FIG. 3 is positioned in-between the first component carrier package 110 and the second component carrier package 120 and is shown prior to mounting the third component carrier package 330 in-between the first component carrier package 110 and the second component carrier package 120 by electrically and mechanically connecting five of the seven third external terminals 332 with five first external terminals 112, and by electrically and mechanically connecting five of the seven third external terminals 333 with the five second external terminals 122. The third component carrier package 330 in FIG. 3 has a larger width than the first component carrier package 110 and the second component carrier packages 120 and may thus have a larger number of third external terminals 332, 333 formed on the first main surface 334 and the second main surface 335, respectively, than the first component carrier package 110 or the second component carrier package 120. By providing the third component carrier package 330, an additional memory (or any other electronic component) may be implemented in the electronic device 300 which may result in an increased performance of the electronic device 300.

The first component carrier package 110 in FIG. 3 is embodied similar to the first component carrier package 110 in FIG. 1. The second component carrier package 120 in FIG. 3 comprises a second electronic component 121 and eight second external terminals 122. Five of the eight second external terminals 122 are provided on one main surface of the second component carrier package 120 facing the second main surface 335 of the third component carrier package 330. On the other three second external terminals 122, solder structures 160 are formed for mounting the electronic component 300 via the second component carrier package 120 to a mounting base (not illustrated in FIG. 3, but illustrated in detail in FIG. 2).

Although the third component carrier package 330 has the same number of third external terminals 332 as third external terminals 333, different numbers of third external terminals 332 and third external terminals 333 are possible.

Figure 4:
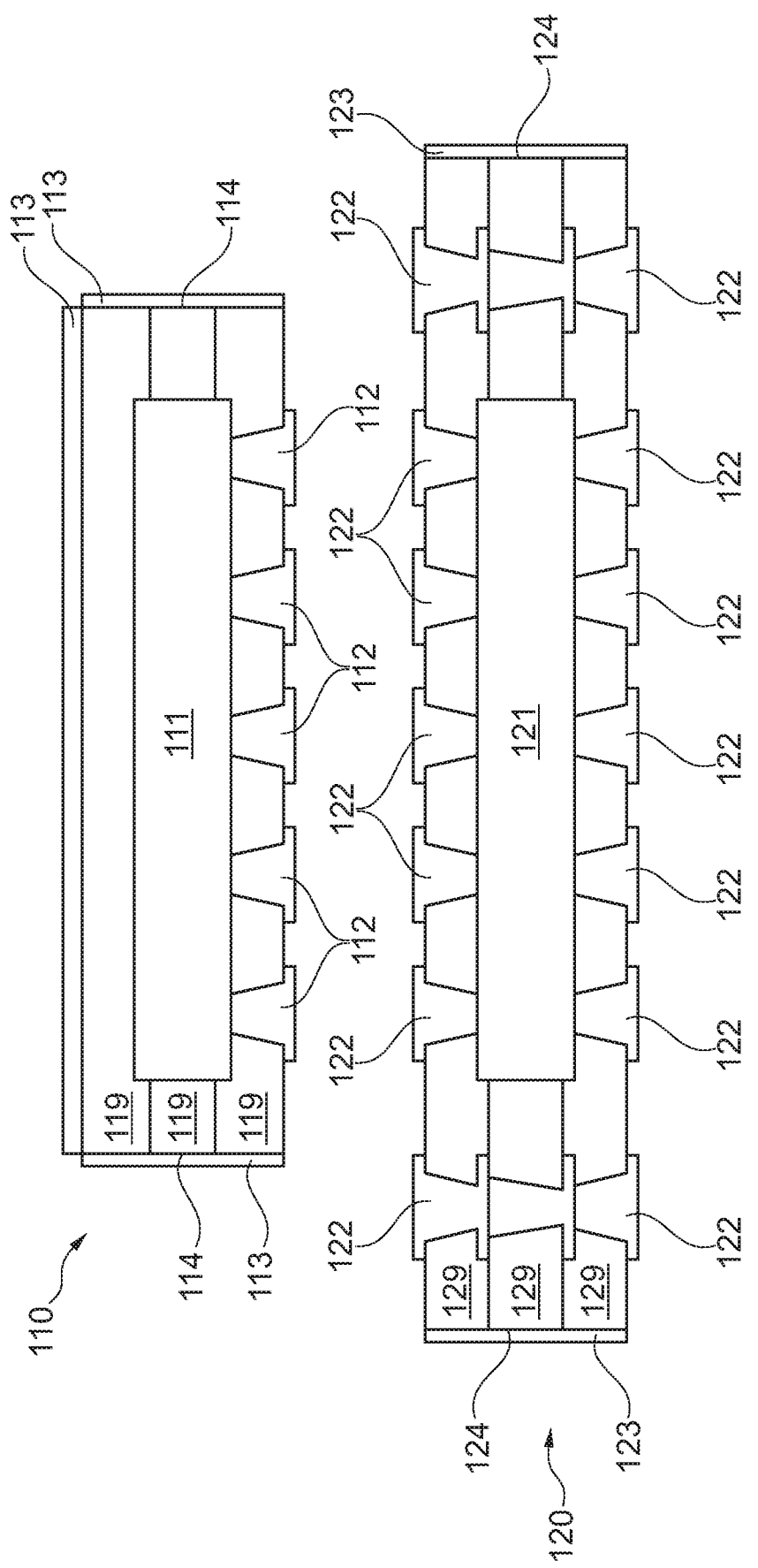
FIG. 4 shows a cross-sectional view of a first component carrier package and a second component carrier package prior to electrically and mechanically connecting the at least one first external terminal and the at least one second external terminal according to an exemplary embodiment of the invention.

FIG. 4 shows a first component carrier package 110 and a second component carrier package 120 prior to electrically and mechanically connecting the first external terminals 112 and the corresponding second external terminals 122 and thus still spaced from each other, according to an exemplary embodiment. A first electronic component 111 is embedded in the first component carrier package 110 which further comprises five first external terminals 112. A second electronic component 121 is embedded in the second component carrier package 120 which further comprises fourteen second external terminals 122, seven on each main surface of the second component carrier package 120. Furthermore, the second electronic component carrier package 120 comprises a second electromagnetic radiation shielding structure 113 covering the lateral sidewalls 124 of the second component carrier package 120 being perpendicular to the main surfaces of the second component carrier package 120. Additionally, the first component carrier package 110 comprises a first electromagnetic radiation shielding structure 113 covering the lateral sidewalls 114 of the first component carrier package 110 and one main surface of the first component carrier package 110 facing away from the second component carrier package 120.

Figure 5:
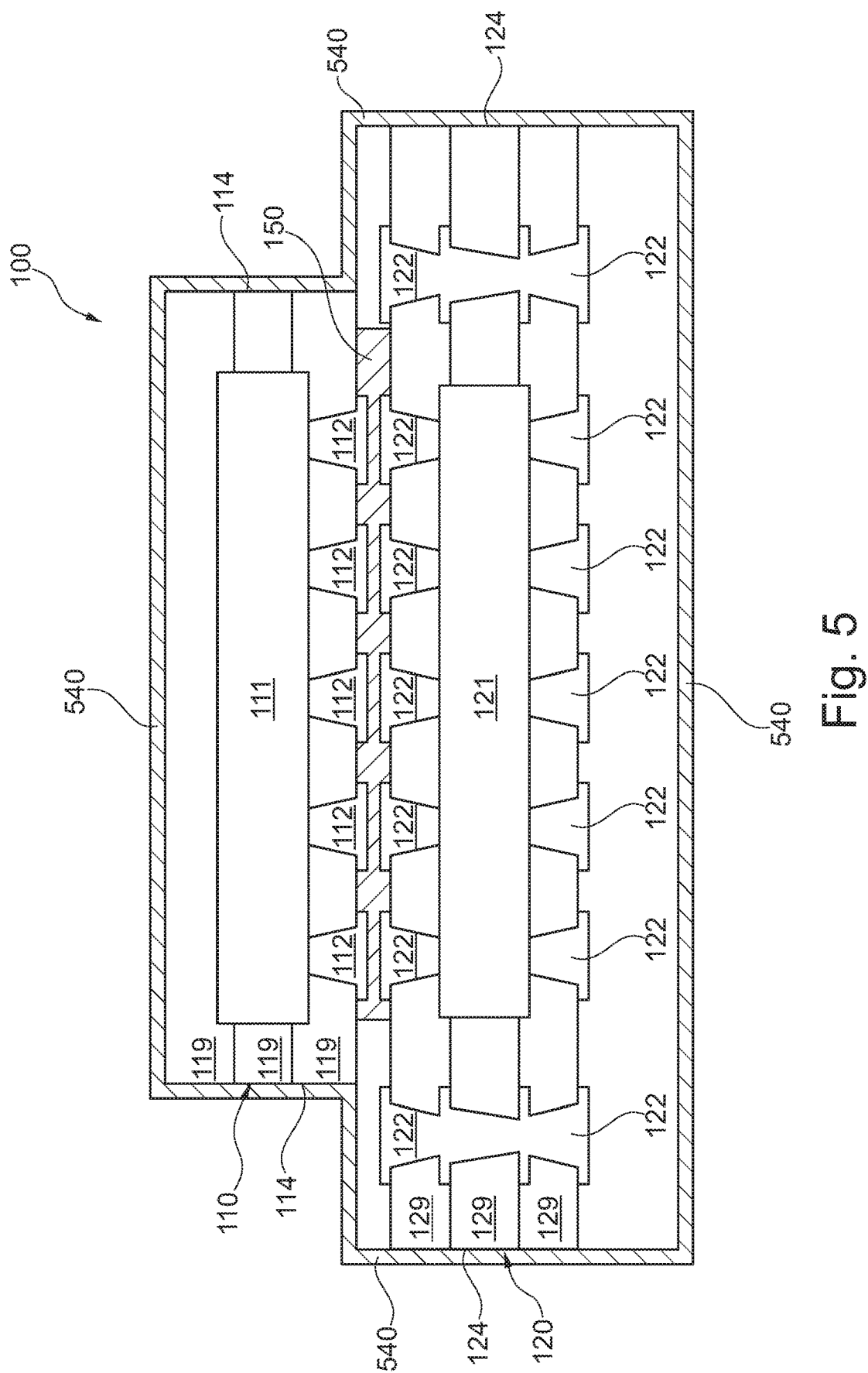
FIG. 5 shows a cross-sectional view of an electronic device which comprises an electromagnetic radiation shielding structure substantially entirely surrounding the electronic device, according to an exemplary embodiment of the invention.

As can be taken from FIG. 5, an electronic device 100 which comprises an electromagnetic radiation shielding structure 540 substantially entirely surrounding the electronic device 100 according to an exemplary embodiment of the invention is shown. The electronic device 100 further comprises a first electronic component 111 embedded in a first component carrier package 110 as described in detail above, in particular in connection with FIG. 1. Furthermore, the electronic device 100 comprises a second electronic component 121 embedded in a second component carrier package 120 as described in detail above, in particular in connection with FIG. 1. Additionally, the first component carrier package 110 comprises five first external terminals 112 and the second component carrier package 120 comprises fourteen second external terminals 122, seven formed on each main surface of the second component carrier package 120, from which five second external terminals 122 are electrically and mechanically connected to the five first external terminals 112 by an adhesive structure 150. The adhesive structure may particularly be formed from an Adhesive Conductive Film (ACF).

The electromagnetic radiation shielding structure 540 provides a hermetic electronic shielding of the electronic device 100. As may be seen in FIG. 5, the electronic device 100 is entirely surrounded by the electromagnetic radiation shielding structure 540 for providing a substantially hermetic electromagnetic shielding of the electronic device 100. The electronic device 100 in FIG. 5 is substantially hermetically shielded from any electromagnetic radiation being present at the exterior of the electronic device 100 and the interior of the electronic device 100 is substantially hermetically shielded vice versa. The electromagnetic radiation shielding structure 540 may have the benefit that a separate formation and connection between a first electromagnetic radiation shielding structure 113 (not shown in FIG. 5, but explained in detail for example in connection with FIG. 1) and a second electromagnetic radiation shielding structure 123 (not shown in FIG. 5, but explained in detail for example in connection with FIG. 1) may be dispensable. Additionally, the electromagnetic radiation shielding structure 540 surrounds the seven second external terminals 122 being positioned on the lower main surface of the second component carrier package 120 without being in a physical contact with one of the seven external terminals 122 on the lower main surface. Thus, the seven external terminals 122 on the lower main surface of the second component carrier package 120 are prevented from being short-circuited with each other via the electromagnetic radiation shielding structure 540. Hence, by providing such a substantially hermetically shielded electronic device 100 as shown in FIG. 5, a high reliability against electromagnetic radiation is providable.

Furthermore, the following aspects of the invention are disclosed:

Aspect 1: A method of manufacturing an electronic device, the method comprising:
embedding a first electronic component in a first component carrier package comprising at least one first external terminal;
embedding a second electronic component in a second component carrier package comprising at least one second external terminal;
in particular subsequently, mounting the second component carrier package on the first component carrier package by electrically and mechanically connecting the at least one first external terminal with the at least one second external terminal.

Aspect 2: The method according to aspect 1, wherein the first component carrier package is a readily manufactured component carrier package being readily manufactured prior to the mounting of the second component carrier package on the first component carrier package.

Aspect 3: The method according to aspect 1 or 2, wherein the second component carrier package is a readily manufactured component carrier package being readily manufactured prior to the mounting of the second component carrier package on the first component carrier package.

Aspect 4: The method according to any one of the aspects 1 to 3, wherein the method further comprises forming an electromagnetic radiation shielding structure on at least part of an exterior surface of at least one of first component carrier package and the second component carrier package, in particular by electroless plating.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:
1. An electronic device, comprising:
a first component carrier package comprising a first electronic component embedded in the first component carrier package and comprising at least one first external terminal;

a second component carrier package comprising a second electronic component embedded in the second component carrier package and comprising at least one second external terminal;

wherein the second component carrier package is mounted on the first component carrier package by electrically and mechanically connecting the at least one first external terminal with the at least one second external terminal;

wherein the first component carrier package further comprises a first electromagnetic radiation shielding structure formed as an electrically conductive coating, the first electromagnetic radiation shielding structure being configured for at least partially shielding electromagnetic radiation from propagating between an exterior and an interior of the first component carrier package;

wherein at least one of the group consisting of the first component carrier package and the second component carrier package comprises a stack of at least one electrically insulating layer structure and/or at least one electrically conductive layer structure.

2. The electronic device according to claim 1, wherein an electrically conductive adhesive structure is applied between the at least one first external terminal and the at least one second external terminal.

3. The electronic device according to claim 2, wherein the adhesive structure comprises at least one of the group consisting of an Anisotropic Conductive Film and an Anisotropic Conductive Paste.

4. The electronic device according to claim 1, wherein the first electromagnetic radiation shielding structure surrounds at least part of the first component carrier package.

5. The electronic device according to claim 1, wherein the second component carrier package further comprises a second electromagnetic radiation shielding structure formed as an electrically conductive coating, the second electromagnetic radiation shielding structure being configured for at least partially shielding electromagnetic radiation from propagating between an exterior and an interior of the second component carrier package.

6. The electronic device according to claim 5, wherein the second electromagnetic radiation shielding structure surrounds at least part of the second component carrier package.

7. The electronic device according to claim 5, wherein the first electromagnetic radiation shielding structure and the second electromagnetic radiation shielding structure are connected to one another, such that the electronic device is entirely surrounded by the first electromagnetic radiation shielding structure and the second electromagnetic radiation shielding structure.

8. The electronic device according to claim 1, further comprising:
an electromagnetic radiation shielding structure configured for providing a substantially hermetic shielding of the electronic device with regard to electromagnetic radiation,
wherein the electronic device is substantially entirely surrounded by the electromagnetic radiation shielding structure.

9. The electronic device according to claim 1, wherein the at least one electrically conductive layer structure of at least one of the first component carrier package and the second component carrier package comprises at least one of the group consisting of copper, aluminum, and nickel.

10. The electronic device according to claim 1, wherein the at least one electrically insulating layer structure of at least one of the first component carrier package and the second component carrier package comprises at least one of the group consisting of resin, Bismaleimide-Triazine resin, cyanate ester, glass, glass fibers prepreg material, polyamide, liquid crystal polymer, epoxy-based Build-Up film, FR4 material, FR5 material, a ceramic, and a metal oxide.

11. The electronic device according to claim 1, comprising at least one of the following features:
at least one of the group consisting of the first component carrier package and the second component carrier package is shaped as a plate;
a package structure of at least one of the first component carrier package and the second component carrier package comprises or consists of one of the group consisting of a printed circuit board, and a substrate;
a package structure of at least one of the first component carrier package and the second component carrier package comprises or consists of a laminate.

12. The electronic device according to claim 1, wherein at least one of the group consisting of the first electronic component and the second electronic component is selected from the group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

13. The electronic device according to claim 1, wherein the first component carrier package and the second component carrier package have different sizes.

14. The electronic device according to claim 1, wherein the first electronic component and the second component have different sizes.

15. The electronic device according to claim 1, wherein the first component carrier package and the second component carrier package differ concerning at least one of the group consisting of a number of layer structures, and a number of external terminals.

16. The electronic device according to claim 1, further comprising:
electrically conductive connection structures arranged on at least part of the at least one second external terminal and configured for mounting the electronic device on a mounting base.

17. An electronic arrangement, comprising:
an electronic device with a first component carrier package and at least one first external terminal, the first component carrier package having an embedded first electronic component,
the electronic device further arranged with a second component carrier package with at least one second external terminal, the second component carrier package having an embedded second electronic component,
the second component carrier package connected to the first component carrier package with the at least one first external terminal and the at least one second external terminal,
the electronic device further arranged with an electromagnetic radiation shield configured to shield an interior of the first component carrier package from electromagnetic radiation;
wherein at least one of the group consisting of the first component carrier package and the second component carrier package comprises a stack of at least one electrically insulating layer structure and/or at least one electrically conductive layer structure; and a mounting base on which the electronic device is mounted so that at least part of the at least one second external terminal provides an electrical connection between the electronic device and the mounting base via one or more solder structures.

18. An electronic device, comprising:

a first component carrier package having a first electronic component embedded in the first component carrier package and at least one first external terminal;

a second component carrier package having a second electronic component embedded in the second component carrier package and at least one second external terminal;

wherein the second component carrier package is mounted on the first component carrier package by electrically and mechanically connecting the at least one first external terminal with the at least one second external terminal;

wherein the first component carrier package further includes a first electromagnetic radiation shielding structure formed as an electrically conductive coating, the first electromagnetic radiation shielding structure being configured for at least partially shielding electromagnetic radiation from propagating between an exterior and an interior of the first component carrier package;

wherein the electronic device further comprises an adhesive structure configured for electrically and mechanically connecting the at least one first external terminal with the at least one second external terminal.

19. An electronic device, comprising:

a first component carrier package comprising a first electronic component embedded in the first component carrier package and at least one first external terminal;

a second component carrier package comprising a second electronic component embedded in the second component carrier package and at least one second external terminal;

wherein the second component carrier package is mounted on the first component carrier package by electrically and mechanically connecting the at least one first external terminal with the at least one second external terminal;

wherein the first component carrier package further comprises a first electromagnetic radiation shielding structure formed as an electrically conductive coating, the first electromagnetic radiation shielding structure being configured for at least partially shielding electromagnetic radiation from propagating between an exterior and an interior of the first component carrier package;

wherein the electronic device further comprises a third component carrier package comprising a third electronic component embedded in the third component carrier package and at least two third external terminals;

wherein a first of the at least two third external terminals is provided at a first main surface of the third component carrier package;

wherein a second of the at least two third external terminals is provided at a second main surface of the third component carrier package, opposing the first main surface of the third component carrier package; and wherein the third component carrier package is mounted between the first component carrier package and the second component carrier package by electrically and mechanically connecting the first of the at least two third external terminals with the at least one second external terminal, and by electrically and mechanically connecting the second of the at least two third external terminals with the at least one first external terminal.

* * * * *